United States Patent
Huang et al.

(10) Patent No.: US 7,317,235 B2
(45) Date of Patent: Jan. 8, 2008

(54) WAFER LEVEL PACKAGE STRUCTURE OF OPTICAL-ELECTRONIC DEVICE AND METHOD FOR MAKING THE SAME

(75) Inventors: Yuan-Chang Huang, Hsinchu (TW); Tai-Hung Chen, Hsinchu (TW); Yao-Sheng Lin, Hsinchu (TW); Su-Tsai Lu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 392 days.

(21) Appl. No.: 11/082,899

(22) Filed: Mar. 18, 2005

(65) Prior Publication Data
US 2006/0030079 A1    Feb. 9, 2006

(30) Foreign Application Priority Data
Aug. 3, 2004    (TW)    ................. 93123228 A (51) Int. Cl.
*H01L 31/0203*    (2006.01)

(52) U.S. Cl. .............. 257/433; 257/E31.124; 257/E31.117; 257/E31.113; 257/434

(58) Field of Classification Search ................ 257/433, 257/434
See application file for complete search history.

(56) References Cited

U.S. PATENT DOCUMENTS

| | | | |
|---|---|---|---|
| 6,627,864 B1 * | 9/2003 | Glenn et al. | 250/208.1 |
| 6,646,289 B1 | 11/2003 | Badehi | |
| 6,864,116 B1 * | 3/2005 | Kim et al. | 438/65 |
| 6,943,423 B2 * | 9/2005 | Kim | 257/433 |
| 6,943,424 B1 * | 9/2005 | Kim | 257/433 |
| 7,015,579 B2 * | 3/2006 | Okada et al. | 257/738 |
| 2007/0069317 A1 * | 3/2007 | Liu | 257/431 |

* cited by examiner

*Primary Examiner*—David A. Zarneke
(74) *Attorney, Agent, or Firm*—Rabin & Berdo, P.C.

(57) ABSTRACT

A wafer level package structure of optical-electronic device and method for making the same are disclosed. The wafer level package structure of optical-electronic device is provided by employing a substrate whose surfaces have several optical sensitive areas and divided into individual package devices. The manufacture steps first involve providing a substrate with several chips whose surfaces have an optical sensitive area and bonding pads, and providing transparent layer whose surfaces have conductive circuits and scribe lines. Then the bonding pads bond to conductive circuits and a protection layer is formed on the chip to expose partly conductive circuits. Forming a conductive film on the protection layer and the conductive film contacts with the extending conductive circuits to form the wafer level package structure of optical-electronic device. At last, the transparent layer is diced according to scribe lines to form the individual package devices.

5 Claims, 8 Drawing Sheets

WAFER LEVEL PACKAGE STRUCTURE OF OPTICAL-ELECTRONIC DEVICE AND METHOD FOR MAKING THE SAME

BACKGROUND OF THE INVENTION

1. Field of Invention

The invention relates to a package structure of an optical-electronic device and the method for making the same. In particular, the invention relates to a wafer level package structure of an optical-electronic device and the manufacturing method thereof.

2. Related Art

The optical-electronic device is the key component in a digital camera device. It converts received optical signals into electrical signals for generating digital pixel data. They are mainly used in various digital image electronics, such as security monitors, digital cameras, computer videoconference devices, mobile phones, PDA's, image phones, and fingerprint recognizers.

As digital image electronics become lighter, more compact and functional, there are higher demands in reducing the packaging cost, increasing the element density, and decreasing the element sizes. As the manufacturing technology improves, transistors become much smaller. Traditional packaging seems to waste space. The mini-packaging of optical-electronic devices nowadays mostly uses the chip on board (COB) packaging or the chip size packaging (CSP). The COB packaging directly packages the die on a printed circuit board (PCB). This packaging technology is actually a miniature surface mounting technology. Metal wires are used to connect I/O pads to the circuit on the PCB. The die is covered by filling with an adhesive agent. This method can effectively transfer the packaging and testing steps during the manufacturing process to the circuit board assembly stage. However, since the die is directly attached onto the circuit board for packaging, it is likely to pollute the lens set during the packaging process, resulting in a lower yield.

The CSP is a wafer level chip size packaging technology, according to which the wafer is first packaged and tested before being cut into individual chips. It does not need bonding and adhesive agent filling steps. The chip size after packaging is the same as the original die. Therefore, the wafer level chip size packaging technology not only keeps the original size of the packaged devices in order to satisfy the high-density integrated space requirement of mobile information products, it also shorten the circuit path on the chip. By directly connecting solder balls with the circuit board, the information transmission speed is highly increases, reducing the noise interference probability.

The integrated circuit (IC) device disclosed in the U.S. Pat. No. 6,646,289 is a CSP method. Several dies are first formed on a wafer (semiconductor substrate), followed by packaging each die. The packaging steps include forming circuits and at least one protection layer on the front surface of the wafer, forming solder pads on the back of the wafer for connecting to the circuits, and cutting the wafer into individual devices. Since the key step in the manufacturing process is to connect the solder pads on the back to the circuits on the front, it is necessary to etch at the scribe lines on the wafer to the protection layer, followed by depositing a conductive film at the etching place for connection to the circuits on the front surface.

SUMMARY OF THE INVENTION

In view of the foregoing, the invention provides a wafer level package structure of optical-electronic devices and the method for making the same in order to simplify the structure and its manufacturing process.

The disclosed method includes the steps of: providing a substrate whose surfaces have a plurality of optical sensitive areas and a plurality of bonding pads, the bonding pads providing electrical communications from each optical sensitive area to the exterior; providing a transparent layer whose surfaces have a plurality of conductive circuits, each of which corresponds a bonding pad on the substrate; connecting the substrate surfaces to the transparent layer surfaces so that the bonding pads are connected to the conductive circuits; dividing the substrate into a plurality of chips, each of which is provided with an optical sensitive area and it corresponding bonding pad; forming a protection layer on each chip and exposing part of the conductive circuit; forming a conductive film on the protection layer so that the conductive film is connected to the exposed conductive circuit; and dicing the transparent layer to form packaged independent devices according to the positions of the chips and corresponding conductive circuits.

The invention further discloses a wafer level package structure of optical-electronic devices. It is formed from a substrate whose surfaces have several optical sensitive areas. Its structure includes several chips, a transparent layer, a protection layer, and a conductive film. The substrate is formed with a transparent layer. The surfaces of the transparent layer have several conductive circuits and more than one scribe line. The substrate surface is in contact with the transparent surface so that the conductive pads are in electrical communications with the conductive circuits. The scribe lines are determined according to the chip and the position of the corresponding conductive circuit. The substrate whose surfaces have several optical sensitive areas is divided into several chips. The surfaces of each chip have an optical sensitive area and several bonding pads, which are used to provide the optical sensitive area electrical communications with the exterior. The protection layer is formed on each chip, exposing part of the conductive circuits. The conductive film is formed on the protection layer, connected to the exposed conductive circuits.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
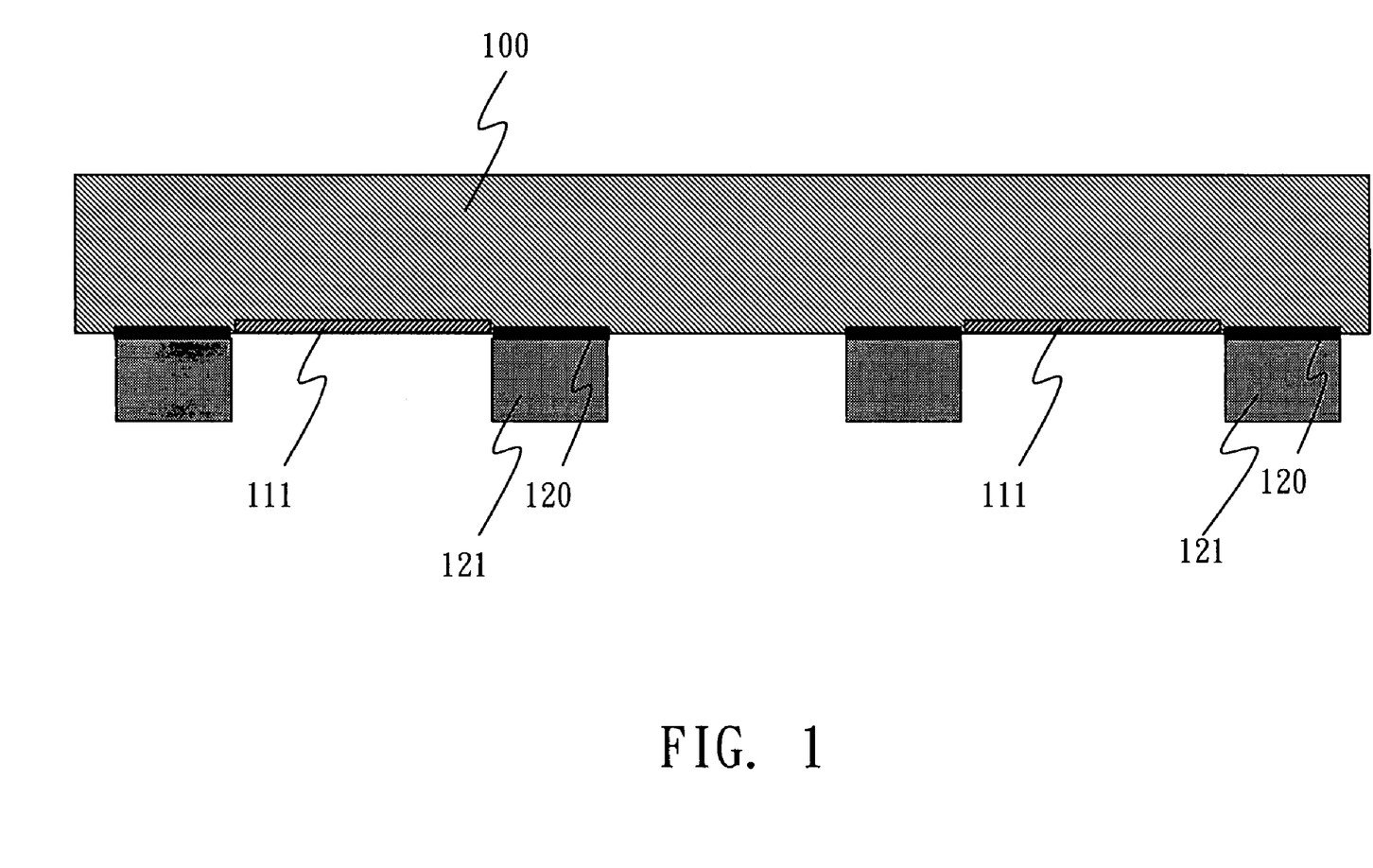
FIGS. 1 to 6 are magnified cross-sectional views of the wafer level package process for optical-electronic devices according to the invention.

We use FIGS. 1 to 6 to explain the wafer level package process of an optical-electronic device. As shown in FIG. 1, a silicon substrate whose surfaces have several optical sensitive areas 111 and several bonding pads is provided. The bonding pad includes a pad 120 and a conductive bump 121 thereon, providing each optical sensitive area 111 electrical communications to the exterior. The optical sensitive area 111 can be an optical sensitive device array.

Figure 2:
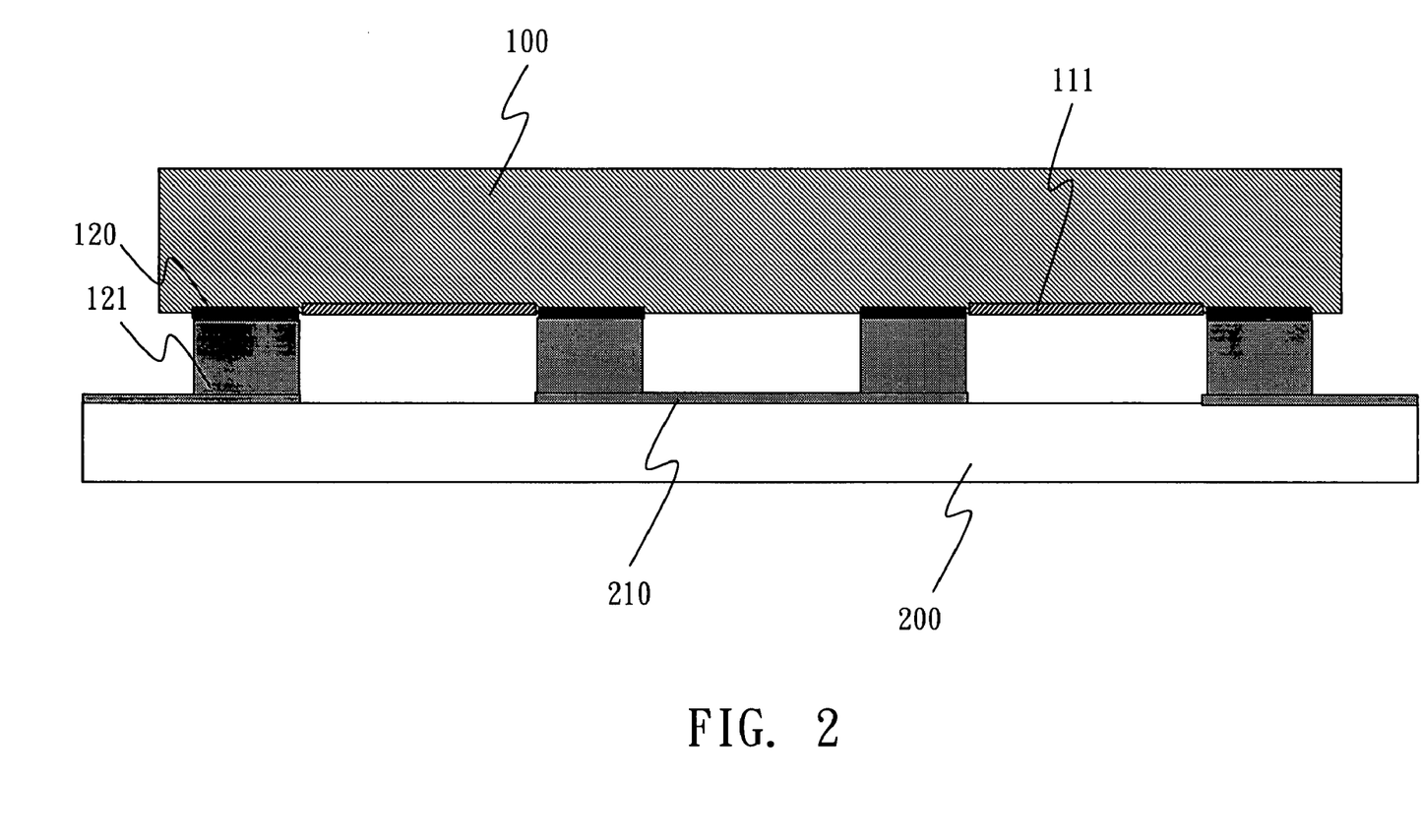

As shown in FIG. 2, a transparent layer 200 whose surfaces have several conductive circuits 210 is provided. The transparent layer 200 and the silicon substrate 100 are aligned and connected, establishing the connections between the conductive circuits 210 and the conductive bumps 121 on the pads.

Figure 3:
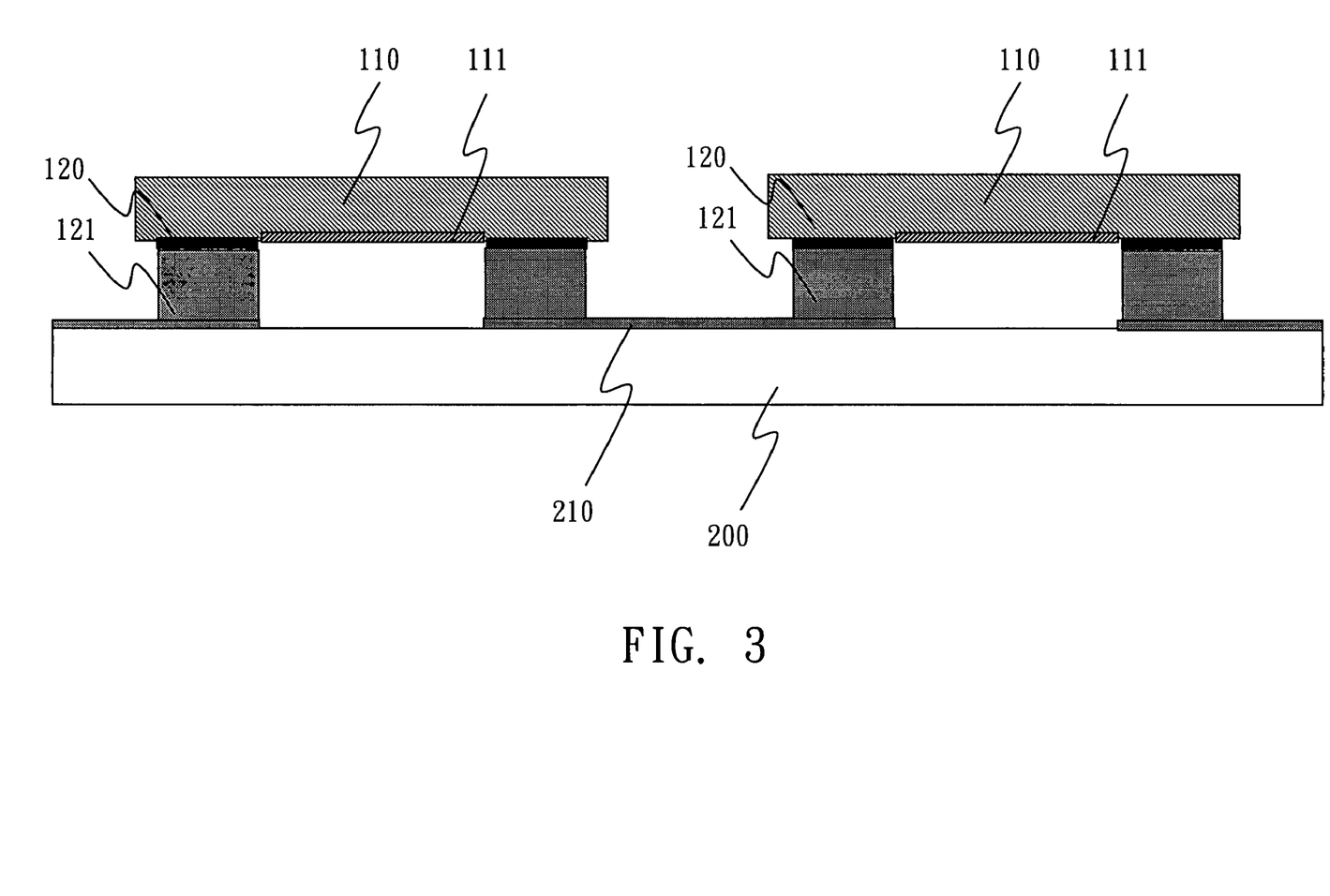

As shown in FIG. 3, the silicon substrate is thinned by etching or polishing. The silicon substrate is divided into several chips 110, so that an independent chip 110 is provided with an optical sensitive area 111 and the corresponding bonding pad.

Figure 4:
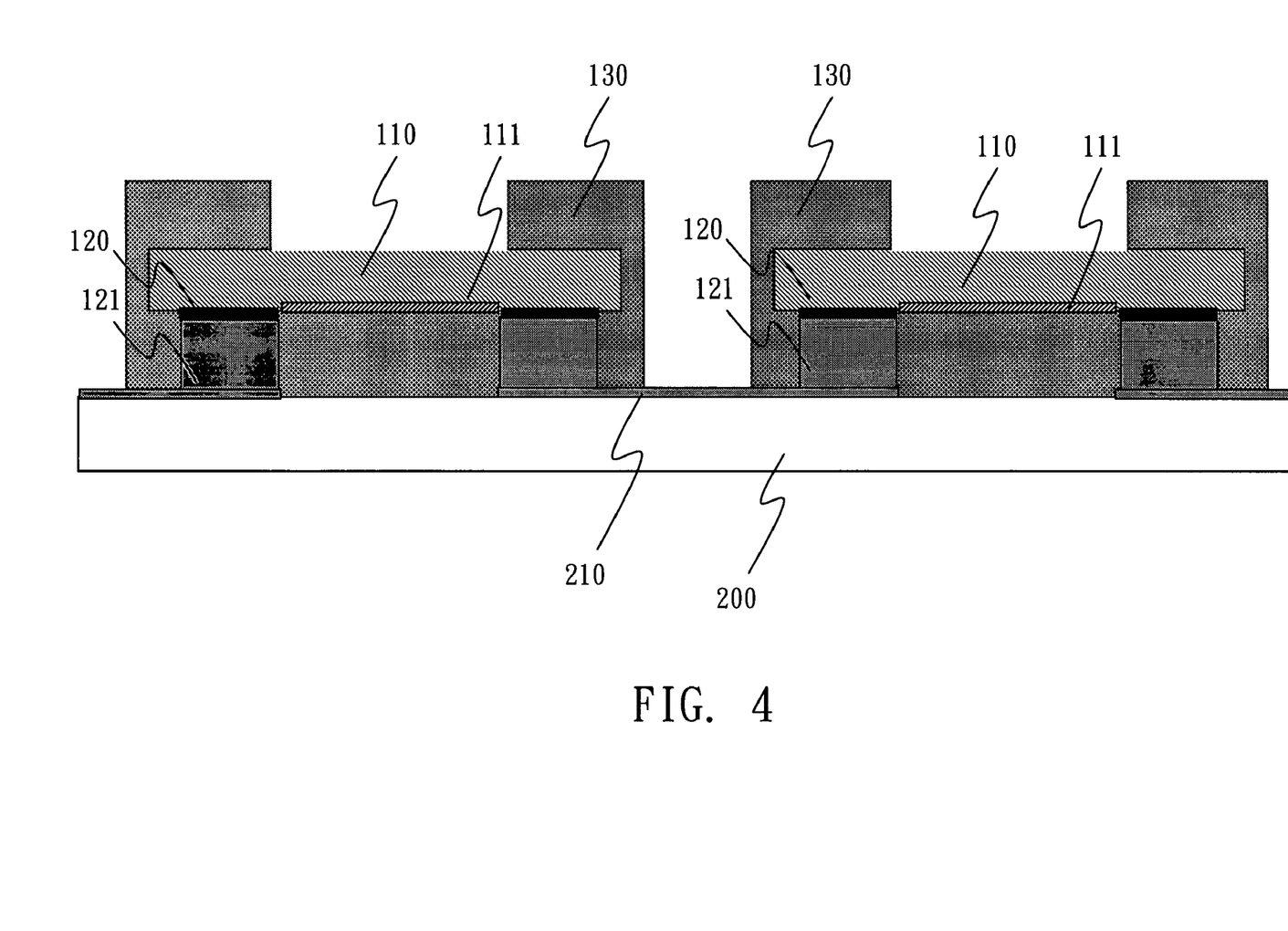

As shown in FIG. 4, a photo resist layer is coated as a protection layer 130 to cover each chip 110. The mask (not shown) is used in the exposure and development steps of the photolithography process. Part of the conductive circuits 210 on the chip 110 and the transparent layer 200 is exposed.

Figure 5:
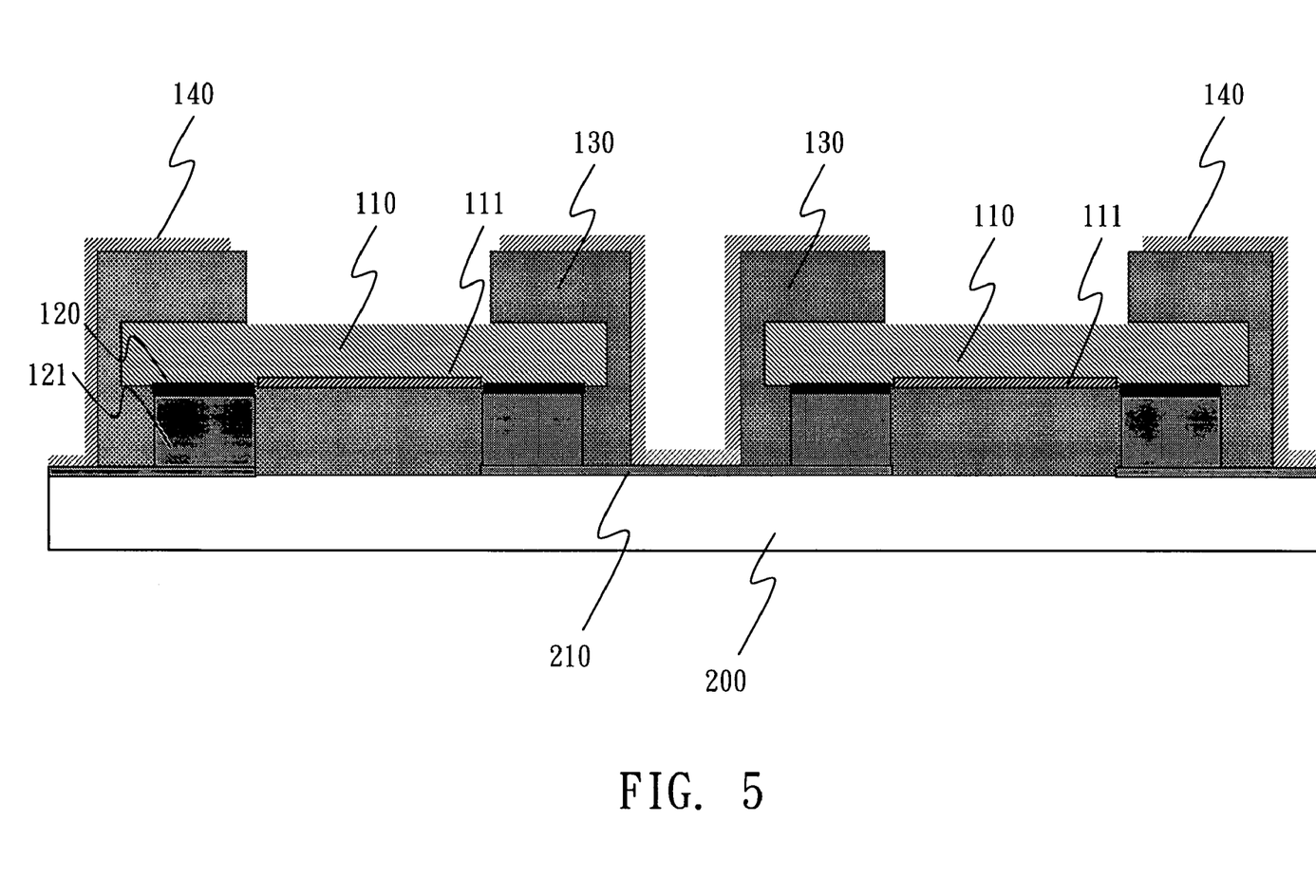

As shown in FIG. 5, a conductive film 140 is formed on the protection layer 130 so that the conductive film 140 is connected to the exposed conductive circuits 210 of the protection layer 130.

Figure 6:
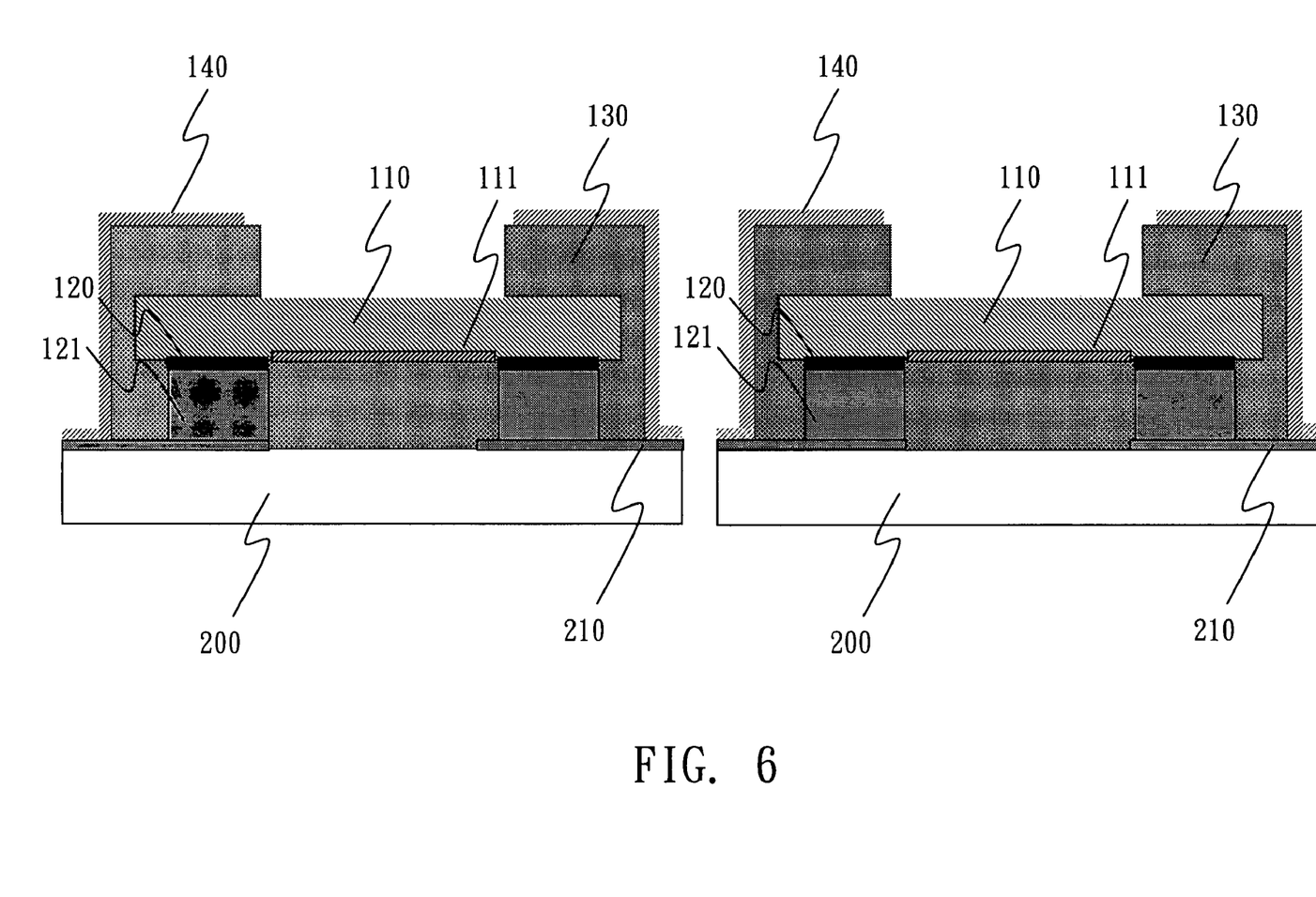
Figure 7:
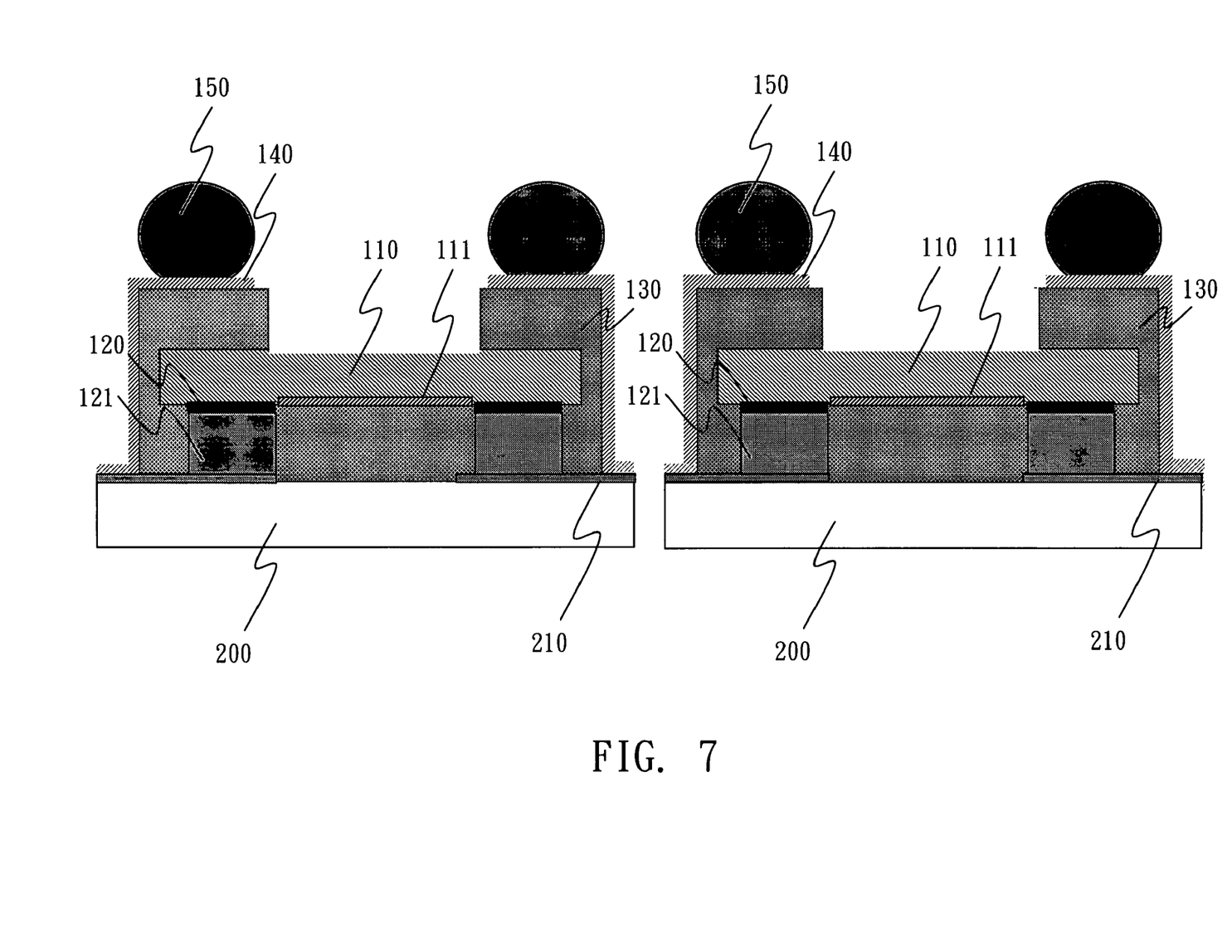
FIG. 7 is a schematic view of forming another packaged device according to the invention.

As shown in FIG. 6, the transparent layer 200 is diced into independent packaged devices according to the chip 100 and the position of the corresponding conductive circuit 210. The conductive film 140 and the protection layer 130 covered by it can be combined to form a compound conductive bump, providing electrical communications of the device to its exterior. Alternatively, as shown in FIG. 7, a solder ball 150 is grown on the conductive film 140 of the packaged independent device for subsequent electrical connections.

Figure 8:
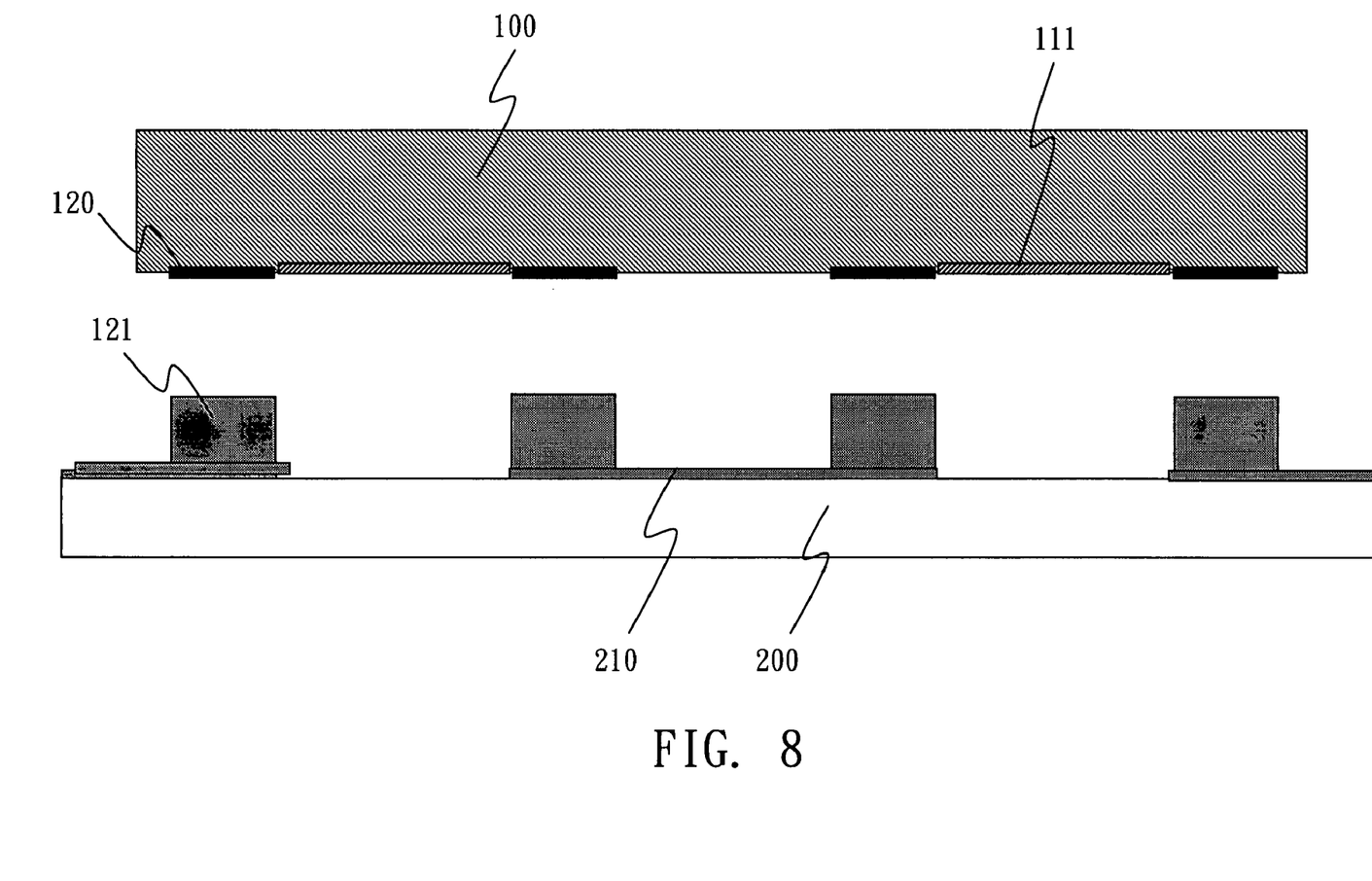
FIG. 8 is a schematic view of another connecting method between the silicon substrate and the transparent layer.

Moreover, the bonding pad can only include a pad. The conductive bump is formed in advance on the conductive circuit of the transparent layer. FIG. 8 shows another connecting method of the silicon substrate and the transparent layer. When connecting the transparent layer 200 and the silicon substrate 100, the conductive bump 121 of the conductive circuit 210 is aligned and connected to the pad 120 of the bonding pad.

The wafer level package structure of optical-electronic devices according to the invention has, as shown in FIG. 5, several chips 110, a transparent layer 200, a protection layer 130, and a conductive film 140. The chips 110 are formed by dividing a silicon substrate whose surfaces have several optical sensitive areas 111. The surfaces of each chip 110 have an optical sensitive area 111 and several bonding pads. The bonding pad includes a pad 120 and a conductive bump 121 thereon for electrical communications of the optical sensitive area 111 to the exterior. The surfaces of the transparent layer 200 have several conductive circuits 210 and scribe lines (not shown). The substrate surface is connected to the transparent layer 200 surface, so that the bonding pads are connected to the conductive circuits 210. The scribe lines are determined according to the positions of each chip 110 and its corresponding conductive circuit 210. The protection later 130 is formed on each chip 110, exposing part of the conductive circuit 210. The conductive film 140 is formed on the protection layer 130 and connected to the exposed conductive circuit 210 on the protection layer 130.

Certain variations would be apparent to those skilled in the art, which variations are considered within the spirit and scope of the claimed invention.

What is claimed is:

1. A wafer level package structure for optical-electronic devices, comprising:

a plurality of chips formed by dividing the substrate, each of which has surfaces with a plurality of optical sensitive areas and a plurality of bonding pads, the bonding pads providing electrical communication between the optical sensitive area and its exterior;

a transparent layer, whose surfaces have a plurality of conductive circuits and more than one scribe line, the substrate surface being connected to the transparent layer surface by connecting bonding pad to the conductive circuit, and the scribe line being determined according the position to each of said chips and said conductive circuits;

a protection layer, which is formed on transparent layer covering each of said chip and partially expose the conductive circuit on said transparent layer; and a conductive film, which is formed on the protection layer and connected to the expose conductive circuit of the transparent layer.

2. The wafer level package structure of optical-electronic devices of claim 1, wherein the optical sensitive area is an array of a plurality of optical sensitive devices.

3. The wafer level package structure of optical-electronic devices of claim 1, wherein the bonding pad includes a conductive bump.

4. The wafer level package structure of optical-electronic devices of claim 1, wherein the conductive circuit includes a plurality of conductive bumps each of which is connected to the associated bonding pad.

5. The wafer level package structure of optical-electronic devices of claim 1, wherein the protection layer is a photo resist layer.

* * * * *